United States Patent
Ahmad et al.

(10) Patent No.: US 9,130,566 B1
(45) Date of Patent: Sep. 8, 2015

(54) PROGRAMMABLE IC WITH POWER FAULT TOLERANCE

(71) Applicant: Xilinx, Inc., San Jose, CA (US)

(72) Inventors: Sagheer Ahmad, Cupertino, CA (US); Roger D. Flateau, Jr., San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/495,811

(22) Filed: Sep. 24, 2014

(51) Int. Cl.
*H03K 19/177* (2006.01)
*H03K 19/007* (2006.01)

(52) U.S. Cl.
CPC ........ *H03K 19/17764* (2013.01); *H03K 19/007* (2013.01); *H03K 19/17748* (2013.01)

(58) Field of Classification Search
CPC ................................................ H03K 19/17764
USPC ........................................... 326/8–10, 38, 41
See application file for complete search history.

(56) References Cited

U.S. PATENT DOCUMENTS

2005/0055695 A1* 3/2005 Law et al. ...................... 718/100
2011/0006806 A1* 1/2011 Arimoto ........................ 326/38

* cited by examiner

*Primary Examiner* — Don Le
(74) *Attorney, Agent, or Firm* — LeRoy D. Maunu

(57) ABSTRACT

A programmable IC is disclosed that includes a programmable logic sub-system, a processing sub-system, and a safety sub-system. The programmable logic circuits in the programmable logic sub-system are configured to form a set of circuits indicated in a set of configuration data. The processing sub-system also executes a software program included in the set of configuration data. The programmable logic sub-system and the processing sub-system are independently powered. In response to a power failure of the processing sub-system and continued power to the programmable logic sub-system, the safety sub-system resets only the processing sub-system. In response to a power failure of the programmable logic sub-system and continued power to the processing sub-system, the safety sub-system resets only the programmable logic sub-system.

20 Claims, 3 Drawing Sheets

PROGRAMMABLE IC WITH POWER FAULT TOLERANCE

FIELD OF THE INVENTION

The disclosure generally relates to monitoring and recovery of power faults.

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a set of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing a program code portion of a user design. In some implementations, the code portion may be input as a portion of the set of configuration data. Alternatively, the program code and the configuration data used to program the programmable elements may be input separately to the programmable IC. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

SUMMARY

A programmable IC is disclosed that includes a programmable logic sub-system, a processing sub-system, and a safety sub-system. The programmable logic sub-system includes a plurality of programmable logic circuits. The processing sub-system executes a software program. In response to a power failure of the processing sub-system and continued power to the programmable logic sub-system, the safety sub-system resets only the processing sub-system. In response to a power failure of the programmable logic sub-system and continued power to the processing sub-system, the safety sub-system resets only the programmable logic sub-system.

A method for operating a programmable IC is also disclosed. A hardware implementation of a user design is operated in a programmable logic sub-system of a programmable IC. A software implementation of the user design is executed on a processing sub-system of the programmable IC. The hardware implementation and the software implementation are functionally equivalent. In response to a power failure of the processing sub-system and continued power to the programmable logic sub-system, the processing sub-system is reset while continuing operation of the hardware implementation of the user design in the programmable logic sub-system. In response to a power failure of the programmable logic sub-system and continued power to the processing sub-system, the programmable logic sub-system is reset while continuing execution of the software implementation of the user design by the processing sub-system.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION OF THE DRAWINGS

Figure 1:
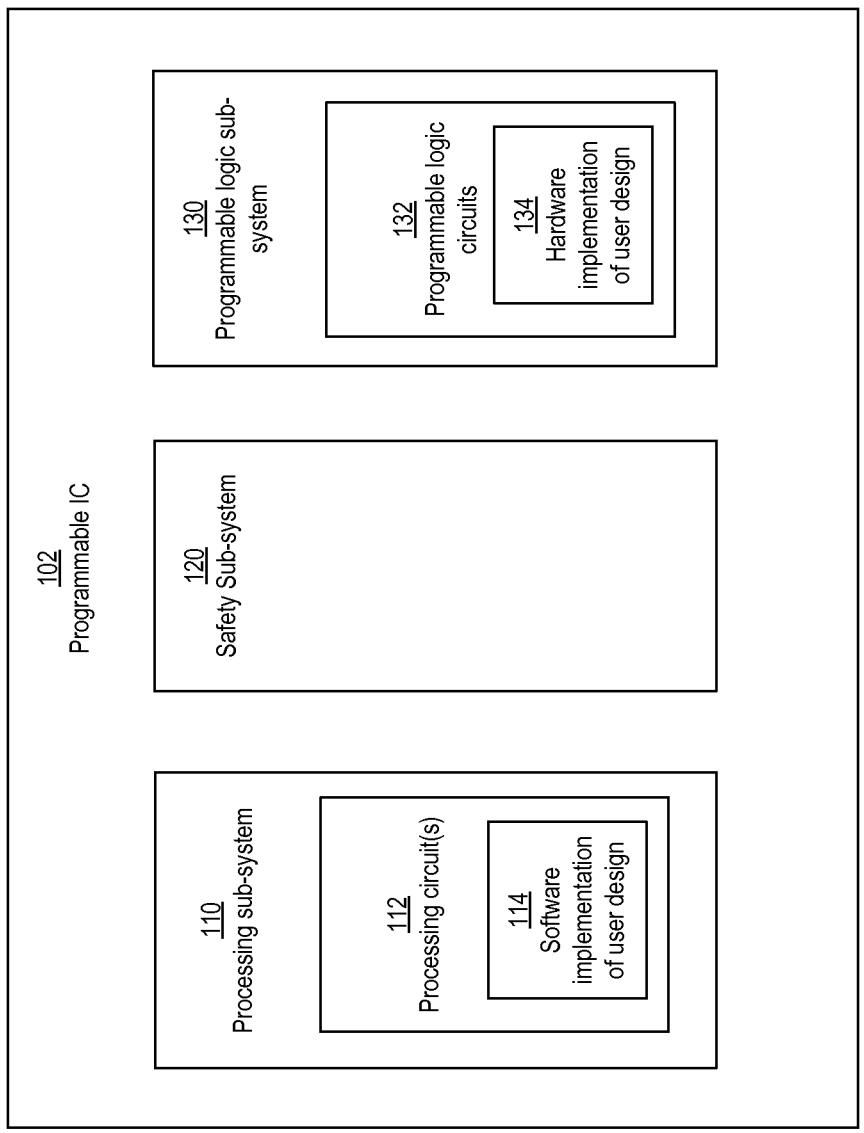
FIG. 1 shows a first example programmable IC with a safety sub-system for power management of redundant sub-systems, in accordance with one or more implementations.

In some mission-critical applications, a programmable IC may use redundant hard-wired circuits to perform a specific mission-critical function. The redundant circuits provide a mechanism to ensure that operation of the mission-critical function continues when an error is encountered in one of the redundant circuits. Because mission-critical functions can vary greatly for different systems and applications, hard-wired redundant circuits may not be suitable in all systems, such as those implemented in programmable ICs.

Circuits and methods are disclosed for providing redundant operation of user-defined functions in a programmable IC. In some implementations, a programmable IC is configured to operate a software implementation of a user design using a processing sub-system of the programmable IC and operate a hardware implementation in a programmable logic sub-system of the programmable IC.

The programmable logic sub-system and the processing sub-system are independently powered in separate power domains. The programmable IC also includes a safety sub-system configured to monitor the processing and programmable logic sub-systems for power loss or other errors. The safety sub-system is also configured to reset the processing and programmable logic sub-systems independent of each other, in response to detecting power loss in the sub-system. For example, in response to detecting power failure in the processing sub-system, the safety sub-system resets the processing sub-system without resetting the programmable logic sub-system. Conversely, in response to detecting power failure in the programmable logic sub-system, the safety sub-system resets the processing sub-system without resetting the programmable logic sub-system. By resetting only one of the processing or programmable logic sub-systems at a time, errors can be handled while continuing operation of a user design in at least one of the sub-systems.

In some implementations, the safety sub-system may be configured to reset one of the sub-systems in response to detecting one or more errors. Errors may include, for example, voltage errors, clock errors, lockstep errors, temperature errors, timeouts, etc. In some implementations, the safety sub-system may be configured to reset a sub-system in response to a specific set of reset conditions specified by the user. For instance, the set of configuration data used to program the programmable logic sub-system may also specify a combination of errors, and a sub-system to be reset in response to the combination of errors.

In some implementations, the processing sub-system and/or programmable logic sub-system may be programmed with configuration data by a configuration circuit when the programmable IC is powered up. If the configuration circuit is operated in the power domain of a first sub-system to be reset, the safety sub-system may perform one or more actions to inhibit reconfiguration of the second sub-system prior to reset of the first sub-system. For example, a processing sub-system and a configuration circuit may be operated in a first power domain and a programmable logic sub-system may be operated in a second power domain. Prior to resetting the processing sub-system (by reset of the first power domain), the safety sub-system may inhibit programming of the programmable logic sub-system by the configuration circuit.

In some implementations, the processing sub-system is configured to program a programmable logic sub-system with a set of configuration data when the processing sub-system is powered up. Normally, reset of the processing sub-system would cause the programmable logic sub-system to be reprogrammed and/or reset. In some implementations, the safety sub-system is configured to suspend reset/reprogramming of the programmable logic sub-system by the processing sub-system prior to resetting the processing sub-system. While implementations are not so limited, for ease of explanation, the examples are primarily described with reference to a system having a processing sub-system configured to program a programmable logic sub-system when powered up.

Due to possible interoperation between the processing and programmable logic sub-systems, it can be difficult to reset an individual sub-system without adversely affecting other sub-systems. In some implementations, a system is isolated from other sub-systems prior to resetting the sub-system. Isolation of a sub-system may be performed by preventing requests to initiate new data transactions from being sent to the sub-system and allowing pending data transactions of the sub-systems to complete. Data transactions may include, for example, read or write transactions. After pending data transactions have completed, the sub-system may be reset.

In some situations, such as sudden power failure, there may not be sufficient time to allow pending data transactions to complete prior to reset. In some implementations, the safety sub-system is configured to set and hold output signal lines of a sub-system to be reset to a set of default values. Holding the signal lines at the default values prevents the random signals generated by the sub-system during reset from reaching the sub-system that is not reset. In some implementations, the default values may prevent the sub-system that is not reset from initiating new data transactions with the sub-system that is being reset.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Turning now to the figures, FIG. 1 shows a first programmable IC, configured in accordance with one or more implementations. The programmable IC 102 includes a processing sub-system 110, a safety sub-system 120, and a programmable logic sub-system 130. The programmable logic sub-system 130 includes a plurality of programmable logic circuits 132. The processing sub-system 110 includes one or more processing circuits 112 configured to execute program code. When powered on, program code executed by the processing circuits programs the programmable logic circuits to form circuitry of a hardware implementation of a user design 134 indicated in a set of configuration data. The processing circuits are also configured to execute program code of a software portion of the user design 114 included in the set of configuration data after programming the programmable logic circuits.

The programmable logic sub-system and the processing sub-system are independently powered in separate power domains. By operating the hardware and software implementations in respective sub-systems that are independently powered, power failure in either of the processing or programmable logic sub-systems can be isolated from the other sub-system—thereby ensuring that one of the hardware or software implementations of the user design remains in operation.

The safety sub-system is configured to reset only the programmable logic sub-system in response to a power failure occurring in the programmable logic sub-system but not in the processing sub-system. The safety sub-system is also configured to reset only the processing sub-system in response to a power failure occurring in the processing sub-system but not in the programmable logic sub-system. Prior to resetting the programmable logic sub-system, the safety sub-system suspends configuration of the programmable logic sub-system by the processing sub-system.

In some implementations, the safety sub-system may also be configured to perform a set of safety functions. The safety functions may perform various actions to detect and/or mitigate errors in the programmable IC. The actions performed by the safety function may include, for example, voltage adjustment, power-down, sub-system reset, error signal generation, data backup, switch to redundant/backup system, and/or built-in-self test. The safety functions may be performed by hardwired circuits in the safety sub-system or by one or more processors in the safety sub-system. In some implementations, one or more of the safety functions may be configured to reset one of the processing or programmable logic sub-systems, in response to detecting an unrecoverable error isolated to that sub-system.

Figure 2:
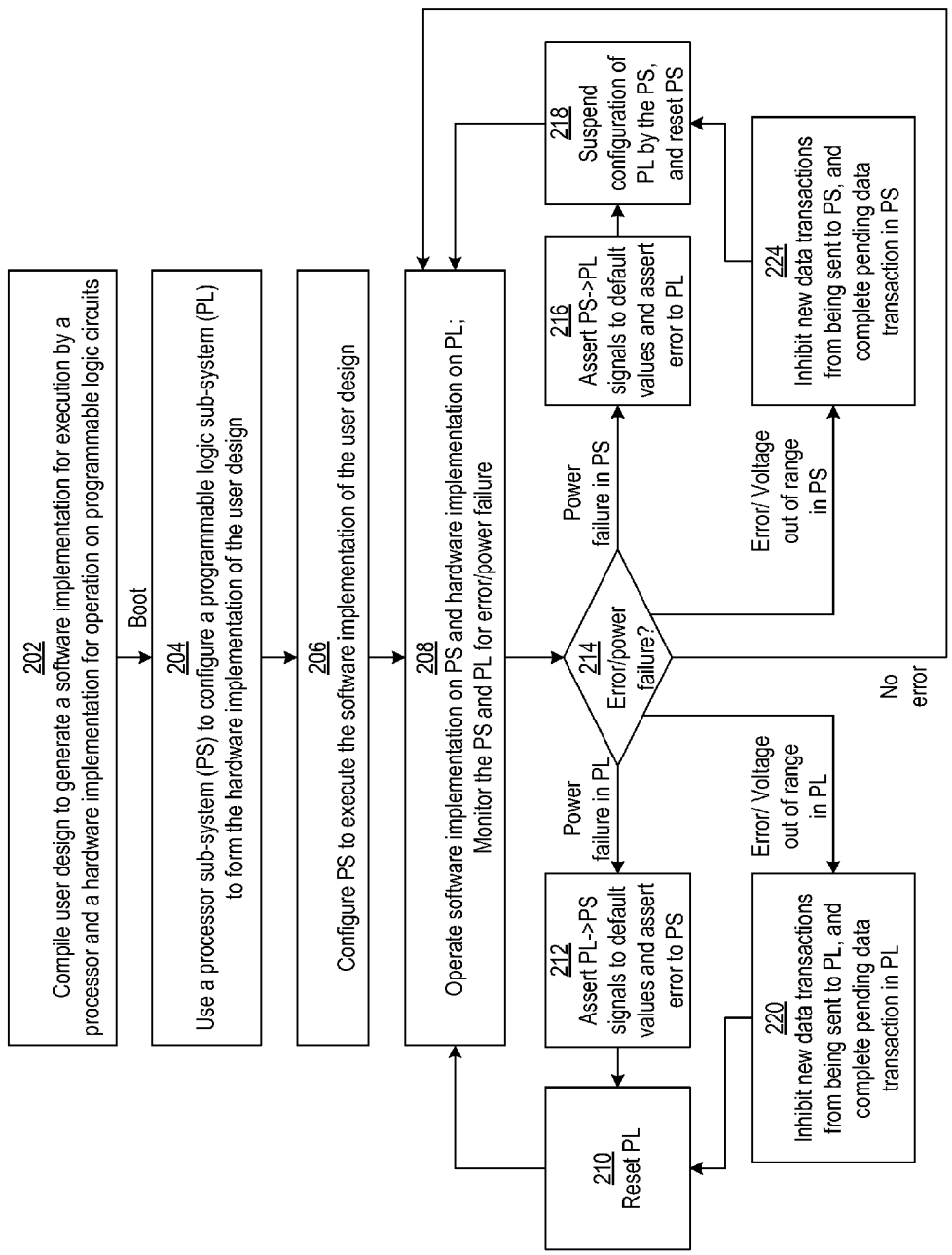
FIG. 2 shows a process for power management of redundant sub-systems, in accordance with one or more implementations.

FIG. 2 shows an example process for operating a programmable IC, consistent with one or more implementations. At block 202, a user design is compiled to generate a software implementation for execution by a processor. At block 202, the user design is also compiled to generate a hardware implementation for operation using programmable logic circuits.

At block 204, a processing (PS) sub-system of the programmable IC is used to program a programmable logic (PL) sub-system of the programmable IC to form the hardware implementation of the user design. At block 206, the processing sub-system is configured to execute the software implementation of the user design. At block 208, the software implementation is operated on the processing sub-system and the hardware implementation is operated on the programmable logic sub-system. Also at block 208, the processing and programmable logic sub-systems are monitored for error and/or power failure.

In response to the process detecting an error in the programmable logic sub-system or a voltage in the programmable logic sub-system being outside of a target voltage range, decision block 214 causes the process to proceed to block 220. At block 220, the process prevents new data transactions from being sent to the programmable logic sub-system, and completes pending data transactions in the programmable logic sub-system. After completing pending data transactions, the programmable logic sub-system is reset at block 210.

In response to the process detecting an error in the processing sub-system or a voltage in the processing sub-system being outside of a target voltage range, decision block 214 causes the process to proceed to block 224. At block 224, the process prevents new data transactions from being sent to the programmable logic sub-system, and completes pending data transactions in the programmable logic sub-system. After completing pending data transactions, configuration of the programmable logic sub-system by the processing sub-system in suspended and the processing sub-system is reset at block 218.

As previously indicated, if sudden power failure occurs, there may not be sufficient time to allow pending data transactions to complete prior to reset. In response to a sudden power failure in the programmable logic sub-system, decision block 214 directs the process to block 212, where signal lines from the programmable logic sub-system to the processing sub-system are set to a first set of default values, and power failure error is asserted to the processing sub-system. Setting the signal lines from the programmable logic sub-system at block 212 prevents any random signals generated during reset from affecting the processing sub-system. In some implementations, the default values may prevent the processing sub-system from initiating new data transactions with the programmable logic sub-system. At block 210, the programmable logic sub-system is reset.

In response to a sudden power failure in the processing sub-system, decision block 214 directs the process to block 216, where signal lines from the processing sub-system to the programmable logic sub-system are set to a second set of default values and power failure error is asserted to the programmable logic sub-system. Setting the signal lines from the processing sub-system at block 216 prevents any random signals generated during reset from affecting the programmable logic sub-system. In some implementations, the default values may prevent the programmable logic sub-system from initiating new data transactions with the processing sub-system. At block 218, configuration of the programmable logic sub-system by the processing sub-system in suspended and the processing sub-system is reset.

After resetting one of the sub-systems, at either block 210 or block 218, or if both systems are operating correctly at decision block 214, operation of the hardware and software portions of the user design continues at block 208.

Figure 3:
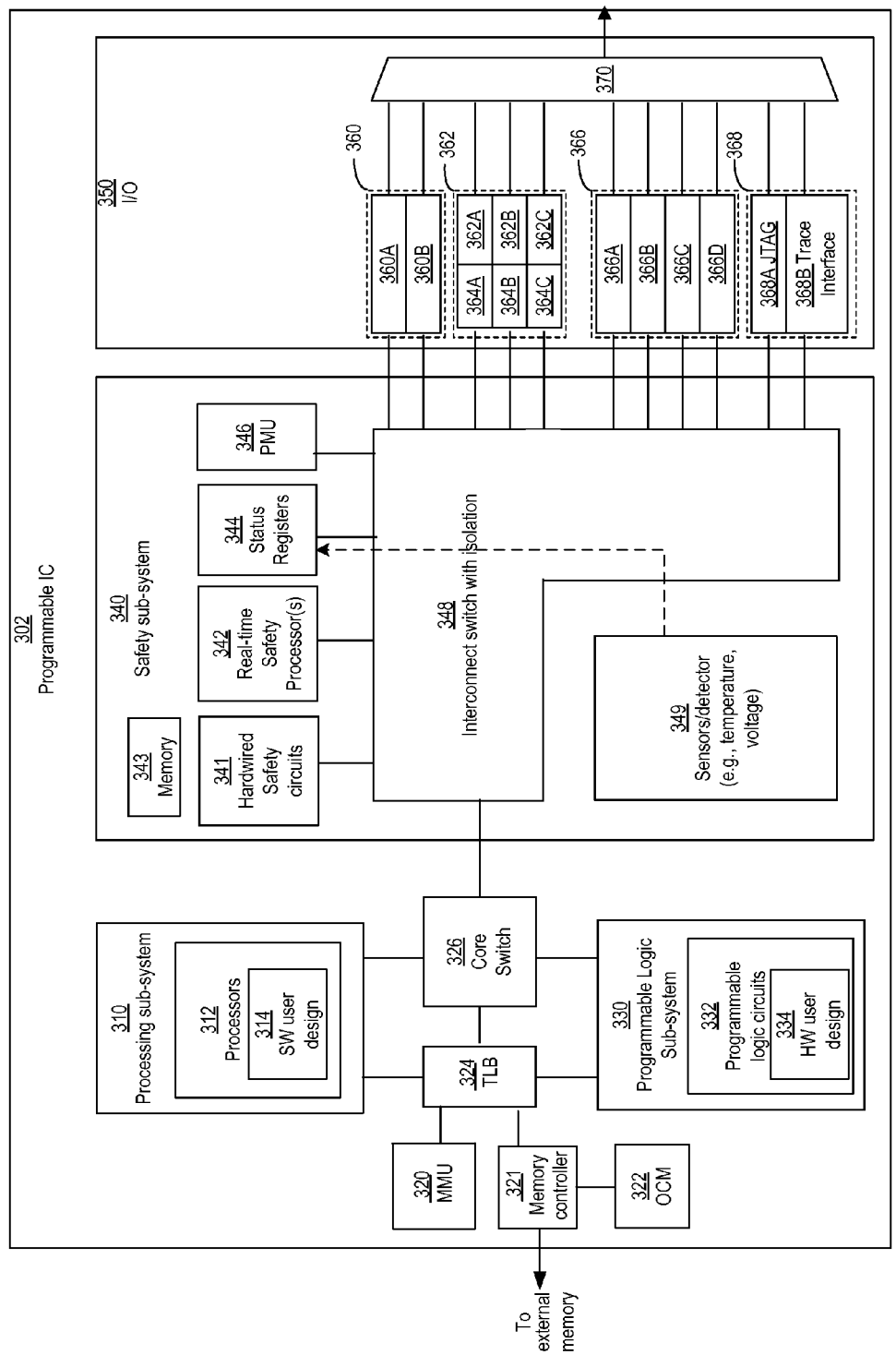
FIG. 3 shows a second example programmable IC with a safety sub-system for power management of redundant sub-systems, in accordance with one or more implementations.

FIG. 3 shows a programmable IC 302 that may be configured in accordance with one or more implementations. The programmable IC may also be referred to as a System-on-chip (SOC), which includes a processing sub-system 310 and a programmable logic sub-system 330. The processing sub-system 310 may be programmed to implement a software portion of the user design, via execution of a user program. The program may be specified as part of a set of configuration data or may be retrieved from an on-chip or off-chip data storage device. The processing sub-system 310 may include various processing circuits 312 for executing a software implementation of a user design 314. The processing circuits 312 may include, for example, one or more processor cores, floating point units (FPUs), an interrupt processing unit, on chip-memory, memory caches, and/or a cache coherent interconnect.

The programmable logic sub-system 330 of the programmable IC 302 may be programmed to implement a hardware portion of a user design. For instance, the programmable logic sub-system may include a number of programmable logic circuits 332, which may be programmed to implement a set of circuits specified in a set of configuration data. The programmable logic circuits 332 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable logic circuits 332 may be programmed by loading a set of configuration data into the configuration memory cells, which define how the programmable interconnect circuits and programmable logic circuits are configured. The collective states of the individual memory cells then determine the function of the programmable logic circuits 332. The configuration data can be read from memory (e.g., from an external PROM) or written into the programmable IC 302 by an external device. In some implementations, configuration data may be loaded into configuration memory cells by a configuration controller 334 included in the programmable logic sub-system 330. In some other implementations, the configuration data may be loaded into the configuration memory cells by a start-up process executed by the processing sub-system 310.

The programmable IC 302 may include various circuits to interconnect the processing sub-system 310 with circuitry implemented within the programmable logic sub-system 330. Connections between circuits and sub-systems are illustrated as lines in FIG. 3. The various connections may be single or multi-bit signal lines and may be uni-directional or bi-directional. In this example, the programmable IC 302 includes a core switch 326 that can route data signals between various data ports of the processing sub-system 310 and the programmable logic sub-system 330. The core switch 326 may also route data signals between either of the programmable logic or processing sub-systems 310 and 330 and various other circuits of the programmable IC, such as an internal data bus. Alternatively or additionally, the processing sub-system 310 may include an interface to directly connect with the programmable logic sub-system—bypassing the core switch 326. Such an interface may be implemented, for example, using the AMBA AXI Protocol Specification (AXI) as published by ARM.

In some implementations, the processing sub-system 310 and the programmable logic sub-system 330 may also read or write to memory locations of an on-chip memory 322 or off-chip memory (not shown) via memory controller 321. The memory controller 321 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 321 is able to communicate is provided for purposes of illustration only and is not intended to be a limitation or to be exhaustive. As shown in FIG. 3, the programmable IC 302 may include a memory management unit 320 and translation look-aside buffer 324 to translate virtual memory addresses used by the sub-systems 310 and 330 to physical memory addresses used by the memory controller 321 to access specific memory locations.

The programmable IC may include an input/output (I/O) sub-system 350 for communication of data with external circuits. The I/O sub-system 350 may include various types of I/O devices or interfaces including for example, flash memory type I/O devices, higher performance I/O devices, lower performance interfaces, debugging I/O devices, and/or RAM I/O devices.

The I/O sub-system 350 may include one or more flash memory interfaces 360 illustrated as 360A and 360B. For example, one or more of flash memory interfaces 360 can be implemented as a Quad-Serial Peripheral Interface (QSPI) configured for 4-bit communication. One or more of flash memory interfaces 360 can be implemented as a parallel 8-bit NOR/SRAM type of interface. One or more of flash memory interfaces 360 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 350 can include one or more interfaces 362 providing a higher level of performance than flash memory interfaces 360. Each of interfaces 362A-362C can be coupled to a DMA controller 364A-364C respectively. For example, one or more of interfaces 362 can be implemented as a Universal Serial Bus (USB) type of interface. One or more of interfaces 362 can be implemented as a gigabit Ethernet type of interface. One or more of interfaces 362 can be implemented as a Secure Digital (SD) type of interface.

The I/O sub-system 350 may also include one or more interfaces 366 such as interfaces 366A-366D that provide a lower level of performance than interfaces 362. For example, one or more of interfaces 366 can be implemented as a General Purpose I/O (GPIO) type of interface. One or more of interfaces 366 can be implemented as a Universal Asynchronous Receiver/Transmitter (UART) type of interface. One or more of interfaces 366 can be implemented in the form of a Serial Peripheral Interface (SPI) bus type of interface. One or more of interfaces 366 can be implemented in the form of a Controller-Area-Network (CAN) type of interface and/or an I$^2$C type of interface.

The I/O sub-system 350 can include one or more debug interfaces 368 such as processor JTAG (PJTAG) interface 368A and a trace interface 368B. PJTAG interface 368A can provide an external debug interface for the programmable IC 302. Trace interface 368B can provide a port to receive debug, e.g., trace, information from the processing sub-system 310 or the programmable logic sub-system 330.

As shown, each of interfaces 360, 362, 366, and 368 can be coupled to a multiplexer 370. Multiplexer 370 provides a plurality of outputs that can be directly routed or coupled to external pins of the programmable IC 302, e.g., balls of the package within which the programmable IC 302 is disposed. For example, I/O pins of programmable IC 302 can be shared among interfaces 360, 362, 366, and 368. A user can configure multiplexer 370, via a set of configuration data to select which of interfaces 360-368 are to be used and, therefore, coupled to I/O pins of programmable IC 302 via multiplexer 370. The I/O sub-system 350, may also include a fabric multiplexer I/O (FMIO) interface (not shown) to connect interfaces 362-368 to programmable logic circuits of the programmable logic sub-system. Additionally or alternatively, the programmable logic sub-system 330 can be configured to implement one or more I/O circuits within programmable logic. In some implementations, the programmable IC 302 may also include a sub-system 340 having various circuits for power and/or safety management. For example, the sub-system 340 may include a power management unit 346 configured to monitor and maintain one or more voltage domains used to power the various sub-systems of the programmable IC 302. In some implementations, the power management unit 346 may disable power of individual sub-systems, when idle, to reduce power consumption, without disabling power to sub-systems in use.

The sub-system 340 may also include safety circuits to monitor the status of the sub-systems to ensure correct operation. For instance, the sub-system 340 may include one or more hard-wired safety circuits 341 configured to perform safety functions for various sub-systems or circuits of the programmable IC. The sub-system 340 may also include one or more real-time processors 342 configured to execute various software-based safety functions for various sub-systems or circuits of the programmable IC.

The sub-system 340 may include one or more sensors or detectors 349 configured to monitor various operating parameters of the programmable IC (e.g., voltage, temperature, clocks and/or data/control signals) and store data indicating the status of the monitored operating parameters in status registers 344. Data flow from the sensors or detectors 349 to the status registers via interconnect switch 348 is illustrated by a dashed line in FIG. 3. The status registers may be accessed, by the hard-wired safety circuits 341, real-time processors 342, or power management unit 346.

The safety functions may monitor the status of the various sub-systems and perform various actions to facilitate detection, prevention, and/or mitigation of errors in one or more sub-systems or circuits. In some implementations, the safety functions may take action in response to the status registers having values indicative of an error. For example, a safety function may generate an alert in response to detecting an error. As another example, a safety function may reset an individual sub-system to attempt to restore the sub-system to correct operation, as discussed with reference to FIGS. 1 and 2.

Sub-systems or circuits to be monitored and conditions in which sub-systems are to be reset may be specified in a safety policy stored in a memory 343. The safety policy performed by the safety sub-system may be hardcoded in a non-volatile memory or may be stored in the memory at startup. In some implementations, the safety policy may be user configurable and provided, for example, in a subset of a set of configuration data.

The sub-system 340 includes an interconnect switch network 348 that may be used to interconnect various sub-systems. For example, the interconnect switch network 348 may be configured to connect the various sub-systems 310, 330, and 340 to various interfaces of the I/O sub-system 350. In some applications, the interconnect switch network 348 may also be controlled by one or more safety functions of the hard-wired safety circuits 341 or real-time safety processors 342 to isolate the real-time processors 342 from the sub-systems that are to be monitored. Such isolation may be required by certain application standards (e.g., IEC-61508 SIL3 or ISO-26262 standards) to ensure that the real-time processors 342 are not affected by errors that occur in other sub-systems. In some applications, interconnect switch network 348 may also be protected (e.g., by ECC or parity) to provide protection against random faults. In some applications, the interconnect switch network 348 may be protected by software-based tests that are periodically performed to test the interconnect switch network 348.

In some implementations, some safety functions may be performed by redundant hard-wired circuits of the hard-wired safety circuits 341. For example, the power management unit 346 may be protected by a safety function performed by a triple modular redundant circuit of the hard-wired safety circuits 341. For example, the hard-wired circuits of the safety sub-system may include a triple modular redundant circuit configured to monitor a power management unit of the programmable IC. As another example, the programmable IC may include a configuration security unit configured to prevent unintended reconfiguration of programmable logic circuits (e.g., during reset of the processing sub-system 310). The configuration security unit may similarly be protected by triple modular redundant circuits.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A programmable integrated circuit (IC), comprising:
   a programmable logic sub-system including a plurality of programmable logic circuits configured to form a set of circuits indicated in a set of configuration data;
   a processing sub-system configured to execute a software program; and
   a safety sub-system configured and arranged to:
      in response to a power failure of the processing sub-system and continued power to the programmable logic sub-system, suspend configuration of the programmable logic sub-system by the processing sub-system; and
      in response to a power failure of the programmable logic sub-system and continued power to the processing sub-system, reset only the programmable logic sub-system.

2. The programmable IC of claim 1, wherein:
   the programmable logic sub-system and the processing sub-system are independently powered;
   the processing sub-system is further configured to program the programmable logic circuits of the programmable logic sub-system to form the set of circuits indicated in the set of configuration data; and
   the safety sub-system is further configured to, in further response to the power failure of the processing sub-system and continued power to the programmable logic sub-system, suspend programming of the programmable logic circuits by the processing sub-system.

3. The programmable IC of claim 1, wherein the safety sub-system is further configured to, in further response to the power failure of the processing sub-system and continued power to the programmable logic sub-system, assert signals from the processing sub-system to the programmable logic sub-system to a first predetermined set of values.

4. The programmable IC of claim 3, wherein the programmable logic sub-system, responsive to the first predetermined set of values, suspends initiating data transactions with the processing sub-system.

5. The programmable IC of claim 3, wherein the safety sub-system is further configured to, in further response to the power failure of the programmable logic sub-system and continued power to the processing sub-system:
   assert signals from the programmable logic sub-system to the processing sub-system to a second predetermined set of values; and
   reset only the programmable logic sub-system.

6. The programmable IC of claim 5, wherein the processing sub-system, responsive to the second predetermined set of values, suspends initiating data transactions with the programmable logic sub-system.

7. The programmable IC of claim 5, wherein the safety sub-system is further configured to:
   in response to resetting the programmable logic sub-system, initialize the programmable logic sub-system based on a state of the processing sub-system; and
   in response to resetting the processing sub-system, initialize the processing sub-system based on a state of the programmable logic sub-system.

8. The programmable IC of claim 1, wherein the safety sub-system is further configured to, in response to a voltage of the processing sub-system being outside of a target voltage range:
   inhibit the programmable logic sub-system from initiating data transactions with the processing sub-system; and
   in response to the processing sub-system completing all pending data transactions, reset only the processing sub-system.

9. The programmable IC of claim 8, wherein the safety sub-system is further configured to, in response to a voltage of the programmable logic sub-system being outside of the target voltage range:
   inhibit the processing sub-system from issuing data transaction requests to the programmable logic sub-system; and
   in response to the programmable logic sub-system completing all pending data transactions, reset the programmable logic sub-system while continuing execution of the software program by the processing sub-system.

10. The programmable IC of claim 1, wherein:
    the safety sub-system is further configured to perform a set of safety functions, each safety function configured to detect errors in a respective one of a plurality of circuits of the programmable IC; and
    at least one of the safety functions is configured to reset one of the programmable logic or processing sub-systems of the programmable IC in response to detecting an error in the one of the programmable logic or processing sub-systems.

11. A method, comprising:
    operating a hardware implementation of a user design in a programmable logic sub-system of a programmable integrated circuit (IC);
    executing a software implementation of the user design on a processing sub-system of the programmable IC, wherein the hardware implementation and the software implementation are functionally equivalent;
    in response to a power failure of the processing sub-system and continued power to the programmable logic sub-system, resetting the processing sub-system while continuing operation of the hardware implementation of the user design in the programmable logic sub-system; and in response to a power failure of the programmable logic sub-system and continued power to the processing sub-system, resetting the programmable logic sub-system while continuing execution of the software implementation of the user design by the processing sub-system.

12. The method of claim 11, further comprising:
in further response to the power failure of the processing sub-system, setting signals from the processing sub-system to the programmable logic sub-system to a first predetermined set of values stored in memory.

13. The method of claim 12, wherein the first predetermined set of values prevent the programmable logic sub-system from initiating data transactions with the processing sub-system.

14. The method of claim 12, in further response to the power failure of the programmable logic sub-system:
asserting signals from the programmable logic sub-system to the processing sub-system to a second predetermined set of values stored in the memory; and
resetting only the programmable logic sub-system.

15. The method of claim 14, wherein the second predetermined set of values prevent the processing sub-system from initiating data transactions with the programmable logic sub-system.

16. The method of claim 11, further comprising:
using the processing sub-system, programming the programmable logic sub-system of the programmable IC with a set of configuration data to form the hardware implementation of the user design; and
in further response to the power failure of the processing sub-system and continued power to the programmable logic sub-system, disabling configuration of the programmable logic sub-system by the processing sub-system.

17. The method of claim 16, further comprising in response to a voltage level of the processing sub-system being outside of a target voltage range:
inhibiting the programmable logic sub-system from issuing data transaction requests to the processing sub-system; and
in response to the processing sub-system completing all pending data transactions, suspending configuration of the programmable logic sub-system by the processing sub-system, and resetting the processing sub-system while continuing operation of the hardware implementation of the user design formed by the programmable logic sub-system.

18. The method of claim 17, further comprising in response to a voltage of the programmable logic sub-system being outside of the target voltage range:
inhibiting the processing sub-system from issuing data transaction requests to the programmable logic sub-system; and
in response to the programmable logic sub-system completing all pending data transactions, resetting the programmable logic sub-system while continuing execution of the software implementation of the user design by the processing sub-system.

19. The method of claim 16, further comprising:
compiling the user design to generate the software implementation of the user design and to generate the hardware implementation of the user design; and
generating the set of configuration data including the software implementation of the user design and the hardware implementation of the user design.

20. The method of claim 11, further comprising:
monitoring the processing and programmable logic sub-systems for errors; and
resetting one of the programmable logic or processing sub-systems of the programmable IC in response to detecting an error in the one of the sub-systems.

* * * * *